US011011558B2

(12) United States Patent
Sakaguchi et al.

(10) Patent No.: US 11,011,558 B2
(45) Date of Patent: May 18, 2021

(54) ENERGY RAY DETECTOR, DETECTION APPARATUS, AND EQUIPMENT

(71) Applicant: CANON KABUSHIKI KAISHA, Tokyo (JP)

(72) Inventors: Kiyofumi Sakaguchi, Miura-gun (JP); Masahiro Kobayashi, Tokyo (JP); Eiichi Takami, Chigasaki (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/178,458

(22) Filed: Nov. 1, 2018

(65) Prior Publication Data
US 2019/0140002 A1 May 9, 2019

(30) Foreign Application Priority Data
Nov. 7, 2017 (JP) ................. 2017-214831

(51) Int. Cl.
H01L 27/146 (2006.01)
H01J 37/244 (2006.01)
(Continued)

(52) U.S. Cl.
CPC ......... *H01L 27/14605* (2013.01); *G01T 1/24* (2013.01); *H01J 37/244* (2013.01);
(Continued)

(58) Field of Classification Search
CPC ........... H01L 27/14636; H01L 27/1463; H01L 27/14605; H01L 27/14661;
(Continued)

(56) References Cited

U.S. PATENT DOCUMENTS 10,134,790 B1 * 11/2018 Wu .................... H01L 27/14689
2012/0086094 A1 * 4/2012 Watanabe ........... H01L 31/0232
257/432

(Continued)

FOREIGN PATENT DOCUMENTS

JP 2000-138365 A 5/2000
JP 2002-231930 A 8/2002
(Continued)

*Primary Examiner* — Thanh T Nguyen
(74) *Attorney, Agent, or Firm* — Canon U.S.A., Inc. IP Division

(57) ABSTRACT

A detector includes a semiconductor layer included in a detection region and a peripheral region, and having a first surface and a second surface opposite to the first surface, and a wiring structure included in at least the detection region, and disposed between a space on the first surface side with respect to the semiconductor layer and a space on the second surface side with respect to the semiconductor layer, wherein a thickness of the semiconductor layer in at least a part of the detection region is smaller than a thickness of the peripheral region including the semiconductor layer, and the thickness of the semiconductor layer is larger than a distance between the first surface in the detection region and the space on the first surface side, and a distance between the second surface in the detection region and the space on the second surface side.

24 Claims, 12 Drawing Sheets

(51) Int. Cl.
*G01T 1/24* (2006.01)
*H01J 37/26* (2006.01)

(52) U.S. Cl.
CPC .......... *H01J 37/26* (2013.01); *H01L 27/1463* (2013.01); *H01L 27/14607* (2013.01); *H01L 27/14636* (2013.01); *H01L 27/14659* (2013.01); *H01L 27/14661* (2013.01)

(58) Field of Classification Search
CPC .......... H01L 27/14607; H01L 27/14659; H01J 37/26; H01J 37/244; H01J 2237/26; H01J 2237/244; G06T 1/24
See application file for complete search history.

(56) References Cited

U.S. PATENT DOCUMENTS

2013/0256824 A1* 10/2013 Mizuta .............. H01L 21/76898
257/459
2015/0214263 A1* 7/2015 Nojima .............. H01L 27/1469
257/431

FOREIGN PATENT DOCUMENTS

| JP | 2003-139703 A | 5/2003 |
| JP | 2004-055903 A | 2/2004 |
| JP | 2013-182923 A | 9/2013 |
| JP | 2013182923 A | 9/2013 |
| JP | 2014-154833 A | 8/2014 |
| JP | 2017515270 A | 6/2017 |

* cited by examiner

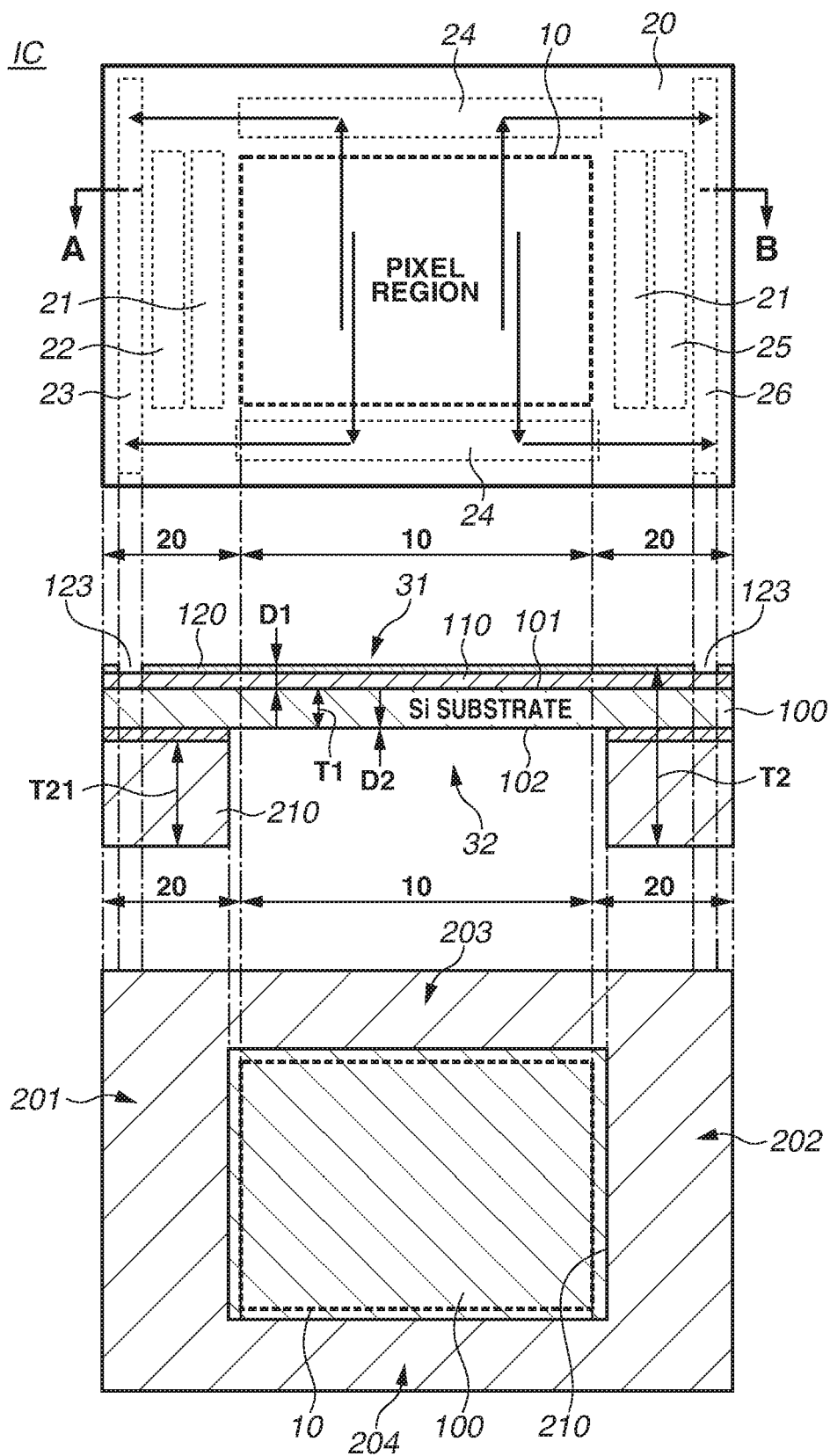

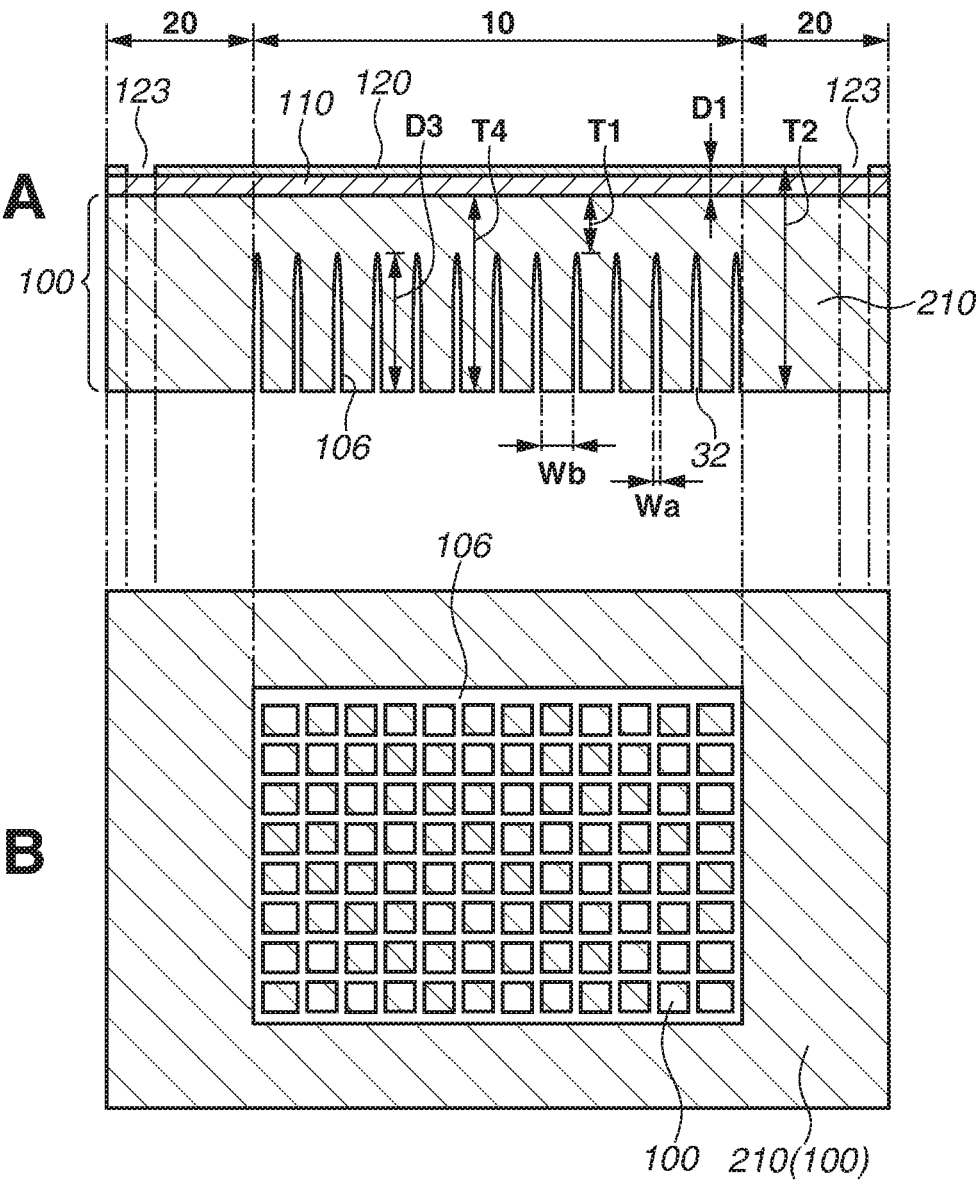

ENERGY RAY DETECTOR, DETECTION APPARATUS, AND EQUIPMENT

BACKGROUND OF THE DISCLOSURE

Field of the Disclosure

The disclosure relates to a detector for detecting an energy ray.

Description of the Related Art

A semiconductor layer can detect an energy ray such as an electromagnetic wave or a particle beam. There is a case where detection accuracy is reduced when an energy ray enters a deep portion of the semiconductor layer. Therefore, it is effective to reduce the thickness of the semiconductor layer.

Japanese Unexamined Patent Application Publication (Translation of PCT Application) No. 2017-515270 discusses a thin direct detector for detecting an electron.

Japanese Patent Application Laid-Open No. 2013-182923 discuses a photoelectric conversion device in which a semiconductor substrate for detecting light is 10 μm or less.

However, even if the thickness of the semiconductor layer is reduced, there is a case where a member on an energy-ray incident surface in the semiconductor layer or on an energy-ray emission surface of the semiconductor layer reduces the accuracy of energy-ray detection.

SUMMARY OF THE DISCLOSURE

The subject disclosure is directed to providing a technology that is advantageous in increasing energy-ray detection accuracy of a detector for detecting an energy ray.

According to a first aspect of the disclosure, a detector has a detection region for detecting an energy ray, and a peripheral region located around the detection region in a plan view with respect to the detection region, and the detector includes a semiconductor layer included in the detection region and the peripheral region, and having a first surface and a second surface opposite to the first surface, and a wiring structure included in at least the detection region, and disposed between a space on the first surface side with respect to the semiconductor layer and a space on the second surface side with respect to the semiconductor layer, wherein a thickness of the semiconductor layer in at least a part of the detection region is smaller than 100 μm, in the detection region, a distance between the space on the first surface side and the space on the second surface side between which the semiconductor layer is interposed is smaller than a thickness of the peripheral region including the semiconductor layer, and the thickness of the semiconductor layer is larger than a distance between the first surface in the detection region and the space on the first surface side, and a distance between the second surface in the detection region and the space on the second surface side.

According to a second aspect of the disclosure, a detector has a detection region for detecting an energy ray, and a peripheral region located around the detection region in a plan view with respect to the detection region, and the detector includes a semiconductor layer included in the detection region and the peripheral region, and having a first surface and a second surface opposite to the first surface, and a wiring structure included in at least the detection region, and disposed between a space on the first surface side with respect to the semiconductor layer and a space on the second surface side with respect to the semiconductor layer, wherein a thickness of the semiconductor layer in at least a part of the detection region is smaller than other part of the semiconductor layer, and wherein the thickness of the semiconductor layer is larger than a distance between the first surface in the detection region and the space on the first surface side, and a distance between the second surface in the detection region and the space on the second surface side.

According to a third aspect of the disclosure, a detector has a detection region for detecting an energy ray, and a peripheral region located around the detection region in a plan view with respect to the detection region, and the detector includes a semiconductor layer included in the detection region and the peripheral region, and a support unit supporting the semiconductor layer in the detection region and the peripheral region, wherein the support unit has a lattice form in the detection region.

Further features and aspects of the disclosure will become apparent from the following description of numerous example embodiments with reference to the attached drawings.

BRIEF DESCRIPTION OF THE DRAWINGS

FIGS. 1A, 1B, and 1C are schematic diagrams illustrating an example detector.
FIGS. 7A and 7B are schematic diagrams illustrating an example detector.

DESCRIPTION OF THE EMBODIMENTS

Figure 2A:
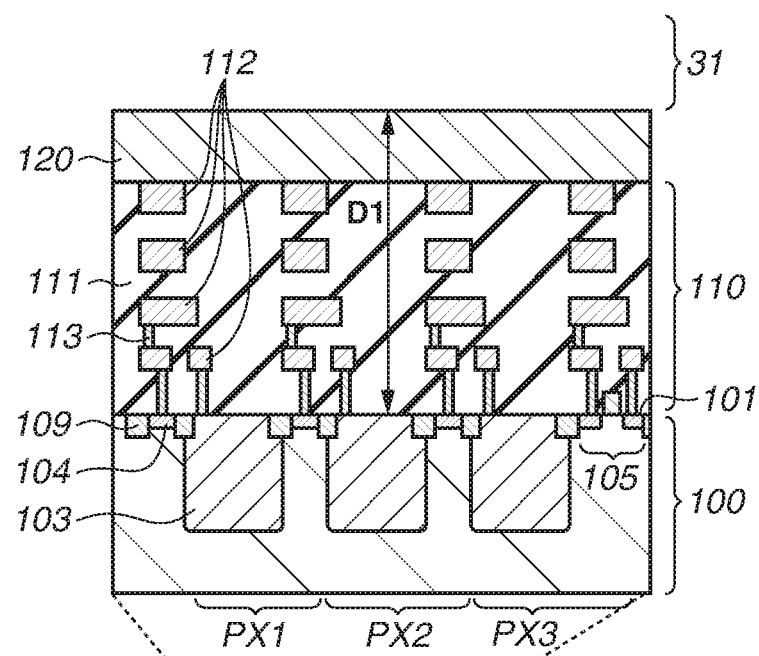
FIGS. 2A, 2B, and 2C are schematic diagrams illustrating an example detector.

Example embodiments of the disclosure will be described below with reference to the drawings. In the following description and drawings, a configuration common to a plurality of drawings will be provided with a common numeral. Therefore, a common configuration will be described with cross-reference to a plurality of drawings, and the description of a configuration provided with a common numeral will be omitted as appropriate. Further, while a plurality of example embodiments will be described, in a case where a point in a certain example embodiment may be similar to that in other example embodiment, the description of such a point will be omitted.

A first example embodiment will be described with reference to FIGS. 1A to 1C and FIGS. 2A to 2C.

FIG. 1A illustrates a plan view when a detector IC is viewed from the top-surface side of the detector IC. FIG. 1B illustrates a cross-sectional diagram of the detector IC taken along a ray A-B in FIG. 1A. FIG. 1C illustrates a plan view when the detector IC is viewed from the under-surface side of the detector IC.

As illustrated in FIG. 1A, the detector IC has a detection region 10 for detecting an energy ray, and a peripheral region 20 located around the detection region 10 in a plan view with respect to the detection region 10. In FIG. 1A, a region inside a range surrounded by a broken ray is the detection region 10, and a region outside the range surrounded by the broken ray is the peripheral region 20. Because a plurality of pixels for forming an image based on an energy ray is arranged in the detection region 10, the detection region 10 can also be referred to as a pixel region.

An energy ray to be detected by the detector IC may be an electromagnetic wave or a particle beam. The electromagnetic wave may be a light beam such as an infrared ray, a visible ray, or an ultraviolet ray. The electromagnetic wave may also be an electric wave such as a microwave, or may also be ionizing radiation such as an X-ray or a gamma ray. Examples of the particle beam include an alpha ray, a beta ray, an electron beam, a neutron beam, a proton beam, a heavy ion beam, and a meson beam. The present example embodiment is suitable for detecting the electron beam. In a case where an energy ray other than the electron beam is to be detected, the structure of the detector IC, in particular, the thickness of a semiconductor layer 100, may be adjusted according to the transmission characteristics or the absorption characteristics of the energy ray.

As illustrated in FIG. 1B, the detector IC includes the semiconductor layer 100 which includes the detection region 10 and the peripheral region 20, and has a surface 101 and a back surface 102 opposite to the surface 101.

For example, a single crystal layer of silicon or germanium is suitable for the semiconductor layer 100, but a polycrystal layer may also be used. Between the surface 101 and the back surface 102 of the semiconductor layer 100, the single crystal structure or the polycrystal structure is continuous without being divided by an insulator layer or a conductor layer. The detector IC is included in at least the detection region 10, and includes a wiring structure 110 disposed between a space 31 on the surface 101 side relative to the semiconductor layer 100 and a space 32 on the back surface 102 side relative to the semiconductor layer 100. Substantially, no solid and liquid is present in the spaces 31 and 32. Each of the spaces 31 and 32 is a vacuum, or a space where gas is present. The spaces 31 and 32 are not included in the detector IC, and are atmosphere around the detector IC. When physically defined, the spaces 31 and 32 each have a relative dielectric constant of 1.0, a relative magnetic permeability of 1.0, and a density of less than 10.0 kg/m$^3$. In the present example embodiment, the wiring structure 110 is located between the semiconductor layer 100 and the space 31. A protective film 120 is provided between the wiring structure 110 and the space 31. The protective film 120 is omissible. The spaces 31 and 32 are each a space of gas or a vacuum when the detector IC is used. Therefore, an energy ray entering the semiconductor layer 100 can propagate through the spaces 31 and 32 with a low loss.

An energy ray to be detected by the detector IC enters the semiconductor layer 100 through one of the space 31 and the space 32. In a case where an energy ray enters the semiconductor layer 100 through the space 31, the energy ray is incident on the surface 101 of the semiconductor layer 100 after passing through the protective film 120 and the wiring structure 110, and then enters the semiconductor layer 100. Typically, the energy ray entering the semiconductor layer 100 goes out from the back surface 102 of the semiconductor layer 100 toward the space 32. In other words, the energy ray passes through the semiconductor layer 100 from the space 31 and then reaches the space 32. In a case where an energy ray enters the semiconductor layer 100 from the space 32, the energy ray is incident on the back surface 102 of the semiconductor layer 100 and then enters the semiconductor layer 100. Typically, the energy ray entering the semiconductor layer 100 passes through the wiring structure 110 and the protective film 120 from the back surface 102 of the semiconductor layer 100, and then goes out toward the space 31. In other words, the energy ray passes through the semiconductor layer 100 from the space 32 and then reaches the space 31.

A thickness T1 of the semiconductor layer 100 in at least a part of the detection region 10 is smaller than a thickness T2 of the peripheral region 20 including the semiconductor layer 100 (T1<T2). The thickness T1 of the semiconductor layer 100 is larger than a distance D between the surface 101 in the detection region 10 and the space 31 on the surface 101 side (D1<T1). The thickness T1 of the semiconductor layer 100 is larger than a distance D2 between the back surface 102 in the detection region 10 and the space 32 on the back surface 102 side (D2<T1). A distance (D1+T1+D2) between the space 31 on the surface 101 side and the space 32 on the back surface 102 side between which the semiconductor layer 100 is interposed in the detection region 10 is smaller than the thickness T2 of the peripheral region 20 including the semiconductor layer 100 (D1+T1+D2<T2). The distance (D1+T1+D2) between the space 31 on the surface 101 side and the space 32 on the back surface 102 side corresponds to the thickness of the detection region 10 including the semiconductor layer 100. The semiconductor layer 100 is interposed in the detection region 10 between the space 31 on the surface 101 side and the space 32 on the back surface 102. The distance (D1+T1+D2) between the space 31 on the surface 101 side and the space 32 on the back surface 102 side is desirably 0.8 times or less the thickness T2 of the peripheral region 20 (D1+T1+D2≤0.8× T2). The detection region 10 is interposed between the space 31 on the surface 101 side and the space 32 on the back surface 102. More desirably, the distance (D1+T1+D2) between the space 31 on the surface 101 side and the space 32 on the back surface 102 side where the detection region 10 is interposed is 0.5 times or less the thickness T2 (D1+T1+D2<0.5×T2), and more desirably, 0.2 times or less the thickness T2 (D1+T1+D2≤0.2×T2).

Reducing the thickness of the detection region 10 is important in order to reduce noise and improve the optical transparency of an energy ray. On the other hand, increasing the thickness of the semiconductor layer 100 is important to obtain a sufficient signal. These two points can be compatible by satisfying D1<T1 and D2<T1 while achieving D1+T1+D2<T2, so that an image with a desirable signal-to-noise ratio can be obtained. The thickness T2 of the peripheral region 20 is made larger than the thickness (D1+T1+D2) of the detection region 10, so that the strength of the entire detector IC is ensured by the peripheral region 20. In the first example embodiment, the distance D1, which is larger than the distance D2 (D2<D1,) may also be equal to the distance D2 or smaller than the distance D2 (D1≤D2) as will be described below in a second example embodiment. In this example, since the back surface 102 directly faces the space 32, the distance D2 is equal to zero. An oxide film of a semiconductor material of the semiconductor layer 100 may be present between the back surface 102 and the space 32.

The surface 101 of the semiconductor layer 100 and the space 31 are separated by the wiring structure 110 and the protective film 120. That is, the distance D1 corresponds to the sum of the thickness of the wiring structure 110 and the thickness of the protective film 120. The thickness T1 of the semiconductor layer 100 is, for example, 1 µm or more and 1000 µm or less, and desirably larger than 10 µm and smaller than 100 µm. The thickness T1 of the semiconductor layer 100 is, typically, 25 µm or more and 75 µm or less. In a case where the detection region 10 detects an electron beam, the thickness T1 of the semiconductor layer 100 is desirably 5 µm or more to achieve sufficient sensitivity. In a case where the semiconductor layer 100 is a silicon layer and detects an electron beam, the sensitivity depends on the thickness T1 as follows. The sensitivity increases as the thickness T1 becomes larger in a range of the thickness T1 of 1 µm to 5 µm, but is not expected to increase greatly if the thickness T1 exceeds 5 µm. The thickness T1 of the semiconductor layer 100 is desirably 15 µm or more to ensure the mechanical strength of the detection region 10. In a case where the semiconductor layer 100 is a silicon layer, the thickness T1 of the semiconductor layer 100 is desirably 20 µm or more to suppress damage to a transistor provided in the semiconductor layer 100. The damage to the transistor was examined by X-ray topography analysis. In a case where the detection region 10 detects an electron beam, the thickness T1 of the semiconductor layer 100 is desirably less than 50 µm to suppress backscattering of generated electrons. Further, the thickness T1 of the semiconductor layer 100 may be 45 µm or less, or 30 µm or less. If the thickness T1 of the semiconductor layer 100 is less than 100 µm, destruction of the detector IC due to chipping of the semiconductor layer 100 easily occurs. However, the destruction of the detector IC can be suppressed by making the thickness T2 of the peripheral region 20 larger than the thickness T1 (T1<T2).

The thickness T2 of the peripheral region 20 is, for example, 10 µm or more and 10000 µm (10 mm) or less, and desirably 100 µm or more and 5000 µm or less. The thickness T2 of the peripheral region 20 is typically 200 µm or more and 1000 µm or less. The thickness T2 of the peripheral region 20 may be less than 500 µm. In this example, the thickness of the semiconductor layer 100 in the peripheral region 20 is equal to the thickness T1 of the semiconductor layer 100 in the detection region 10. A thickness (T2−T1) determined by subtracting the thickness of the semiconductor layer 100 in the peripheral region 20 from the thickness T2 of the peripheral region 20 is larger than the thickness T1 of the semiconductor layer 100 in the detection region 10 (T1<T2−T1).

The peripheral region 20 includes a support unit 210 for supporting the semiconductor layer 100 in the peripheral region 20. A half or more of the thickness T2 of the peripheral region 20 is formed by a thickness T21 of the support unit 210 (T2/2≤T21). The thickness T21 of the support unit 210 is larger than the thickness T1 of the semiconductor layer 100 in the detection region 10 (T1<T21). The thickness T21 of the support unit 210 may be 400 µm or less, but is desirably 100 µm or more. Further, the thickness T2 of the peripheral region 20 includes the thickness of an intermediate layer 220 disposed between the support unit 210 and the semiconductor layer 100. In a case where also the peripheral region 20 is provided with the member (the wiring structure 110 or the protective film 120) which is located between the space 31 and the space 32 in the detection region 10, the thickness T2 of the peripheral region 20 also includes the thickness of this member.

The material of the support unit 210 may be any of a semiconductor, an insulator, and a conductor if the material has sufficient rigidity to support the semiconductor layer 100. However, it is desirable to use a semiconductor material of a type similar to the semiconductor layer 100 in order to reduce stress between the semiconductor layer 100 and the support unit 210. In other words, the support unit 210 is desirably silicon if the semiconductor layer 100 is a silicon layer, and the support unit 210 is desirably germanium if the semiconductor layer 100 is a germanium layer. In a case where the support unit 210 is a semiconductor, the semiconductor layer 100 and the support unit 210 may form a semiconductor single crystal in which the respective crystal structures are continuous. In this case, the intermediate layer 220 may be absent, or the intermediate layer 220 may be a semiconductor layer doped with impurity. In an example of the case where the semiconductor layer 100 and the support unit 210 form the semiconductor single crystal, the semiconductor single crystal having the semiconductor layer 100 and the support unit 210 can be obtained by processing a wafer cut from a semiconductor ingot. In another example, the semiconductor single crystal having the semiconductor layer 100 and the support unit 210 can be obtained by applying epitaxial growth of the semiconductor layer 100 to a semiconductor substrate including the support unit 210 that is a single crystal semiconductor. The intermediate layer 220 between the support unit 210 and the semiconductor layer 100 may be an insulator layer. In this case, by processing the SOI wafer, a semiconductor layer (S) of a semiconductor on insulator (SOI) wafer can be formed as the semiconductor layer 100, an insulator layer (I) of the SOI wafer can be formed as the intermediate layer 220, and a substrate can be formed as the support unit 210.

As illustrated in FIG. 1C, the peripheral region 20 has a quadrilateral shape formed of a left side portion 201, a right side portion 202, an upper side portion 203, and a lower side portion 204, in a plane view. The space 32 is surrounded by the peripheral region 20 of the quadrilateral shape. To be more specific, the space 32 is located between the left side portion 201 and the right side portion 202, in a lateral direction in the plan view. Further, the space 32 is located between the upper side portion 203, and the lower side portion 204 in a vertical direction in the plan view. The vertical direction is orthogonal to the lateral direction.

Figure 2B:
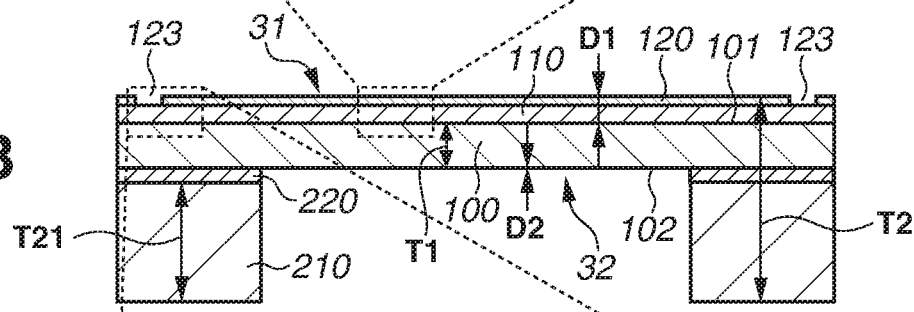
Figure 2C:
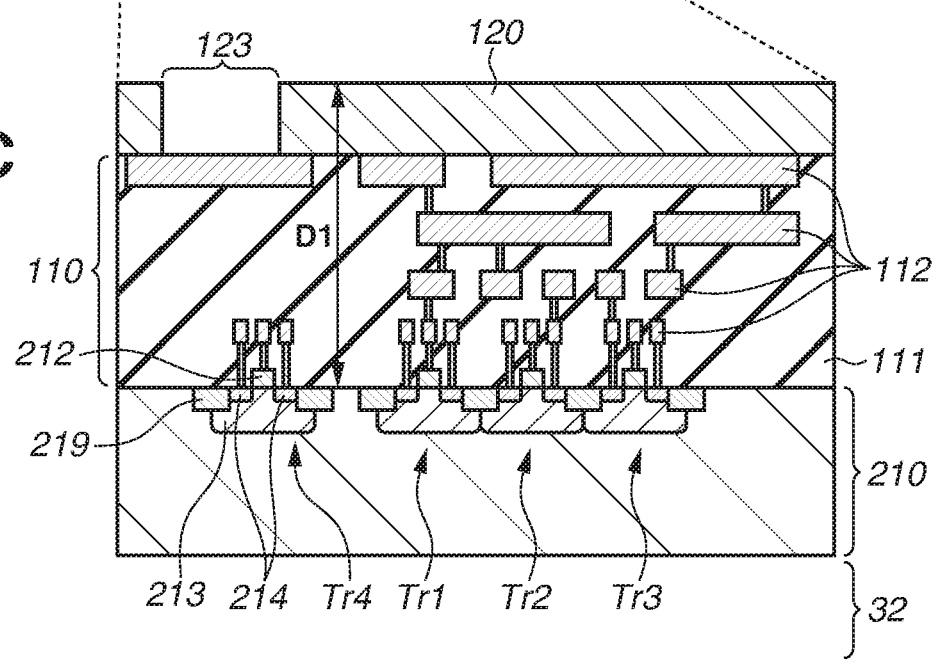

FIG. 2B is a cross-sectional diagram similar to FIG. 1B. FIG. 2A illustrates a cross-sectional diagram of an enlarged cross section of a part of the detection region 10 in FIG. 2B. FIG. 2C illustrates a cross-sectional diagram of an enlarged cross section of a part of the peripheral region 20 in FIG. 2B.

As illustrated in FIG. 2A, the wiring structure 110 includes an interlayer insulating film 111 which is a laminated film formed of a plurality of insulator layers. Further, the wiring structure 110 includes a plurality of conductor layers 112 insulated by the interlayer insulating film 111. Each of the plurality of conductor layers 112 is a wiring layer. The conductor layers 112 are interconnected by a conductive member 113 which is a via plug provided in a via hole of the interlayer insulating film 111 between the conductor layers 112. The interlayer insulating film 111 and the plurality of conductor layers 112 are provided between the surface 101 and the space 31. The protective film 120 covers the wiring structure 110 between the space 31 and the wiring structure 110, and the protective film 120 faces the space 31. The protective film 120 can be an insulator film made of an inorganic insulating material, such as a silicon oxide film, a silicon nitride film, or a silicon carbide film. The protective film 120 can be an insulator film made of an inorganic insulating material such as a silicon oxide film, a silicon nitride film, a silicon carbide film, or a metal oxide film. Further, a protective film can be provided between the space 32 and the semiconductor layer 100. This protective film can also be an insulator film made of an inorganic insulating material such as a silicon oxide film, a silicon nitride film, a silicon carbide film, or a metal oxide film.

A detection unit 103 for detecting an energy ray entering the semiconductor layer 100 is provided inside the semiconductor layer 100 in the detection region 10. The detection unit 103 has, for example, a diode structure, and collects electrons (holes) generated by the energy ray in a cathode (anode) of a diode. A control unit 104 performs control to stop the detection of an energy ray by the detection unit 103, and to reset electric charge generated by the energy ray. In a case where the control unit 104 stops the detection of the energy ray, the control unit 104 can be referred to as a quench unit. The control unit 104 can include a metal oxide semiconductor (MOS) structure or a resistor made of a semiconductor or conductor. The detection region 10 is provided with an output unit 105 connected to the detection unit 103. The output unit 105 outputs a signal based on a detection level of the detection unit 103. The output unit 105 can include, for example, an inverter circuit or a source follower circuit. A readout circuit including the control unit 104 and the output unit 105 is configured of a plurality of MOS transistors. The readout circuits are provided in a matrix form in the detection region 10. The MOS transistors of the readout circuit are isolated from each other by an element isolation portion 109 having a shallow trench isolation (STI) structure or a local oxidation of silicon (LOCOS) structure. In the detection region 10, a plurality of pixels PX1, PX2, and PX3 each including at least one detection unit 103 are arranged in a matrix form. The plurality of pixels PX1, PX2, and PX3 each include the control unit 104. The output units 105 are also arranged in a matrix form in the detection region 10. The plurality of pixels PX1, PX2, and PX3 share the output unit 105, but each of the plurality of pixels PX1, PX2, and PX3 can have the output unit 105.

As illustrated in FIG. 1A, the peripheral region 20 is provided with a drive circuit 21, a control circuit 22, an input terminal portion 23, a signal processing circuit 24, an output circuit 25, and an output terminal portion 26. The drive circuit 21 scans and drives the readout circuits of the detection region 10. The signal processing circuit 24 processes a signal from the readout circuit of the detection region 10, and includes an amplifier circuit and an analog-to-digital (A/D) converter circuit. The output circuit 25 converts a signal obtained by the signal processing circuit 24 into a predetermined form and outputs the result. The output circuit 25 includes a differential transmission circuit. The control circuit 22 controls driving timing of circuits such as the drive circuit 21 and the signal processing circuit 24, and includes a timing generator. The input terminal portion 23 receives power supply and a control signal input from the outside, and the output terminal portion 26 outputs a signal to the outside. Since the peripheral circuits are thus disposed in the peripheral region 20, the peripheral region 20 can be referred to as a peripheral circuit region.

As illustrated in FIG. 2C, the protective film 120 has an opening 123. Through the opening 123, a terminal (a pad) of the input terminal portion 23 or the output terminal portion 26 is connected to the outside. The peripheral region 20 is also provided with the wiring structure 110. A complementary metal oxide semiconductor (CMOS) circuit including a MOS transistor Tr1 of N-type and a MOS transistor Tr2 of P-type is provided in the peripheral region 20. In addition, MOS transistors Tr3 and Tr4 are provided. The MOS transistors Tr1 to Tr4 each have a gate electrode 212 and a source drain region 214. The MOS transistors Tr1 to Tr4 are each provided in a well 213. The MOS transistors Tr1 to Tr4 are isolated from each other by an element isolation portion 219 having a STI structure or a LOCOS structure.

Noise can be reduced by a reduction in the thickness of the semiconductor layer 100 in the detection region 10. If the semiconductor layer 100 is thick, an energy ray interacts with the semiconductor layer 100 in a wide range, and can thereby generate an excess signal equal to or more than the entering energy ray. This excess signal becomes noise, thereby reducing a signal-to-noise ratio in the energy ray detection. In contrast, reducing the thickness of the semiconductor layer 100 can suppress the interaction between the energy ray and the semiconductor layer 100. Therefore, the noise can be reduced.

The distances D1 and D2 from the semiconductor layer 100 to the spaces 31 and 32 provided above and below the semiconductor layer 100 (D1<T1, D2<T1) may be reduced. This reduction can suppress interaction between the energy ray and the members provided between the semiconductor layer 100 and the spaces 31 and 32. For example, in a case where the energy ray enters the semiconductor layer 100 from the space 31, attenuation and absorption of the energy ray by the member between the semiconductor layer 100 and the space 31 can be suppressed. In a case where the energy ray goes out from the semiconductor layer 100 to the space 32, reflection of the energy ray by the member between the semiconductor layer 100 and the space 32 can be suppressed. These also hold true for a case where the energy ray travels in reverse (from the space 32 to the space 31).

The semiconductor layer 100 reduced in thickness in the detection region 10 is held by the thick peripheral region 20, so that the strength of the detector IC can be ensured. In particular, in a case where the thickness of the semiconductor layer 100 is smaller than 100 μm, chipping and cracking easily occurs in the semiconductor layer 100 and thus, an effect of increasing the thickness of the peripheral region 20 is higher.

Figure 3A:
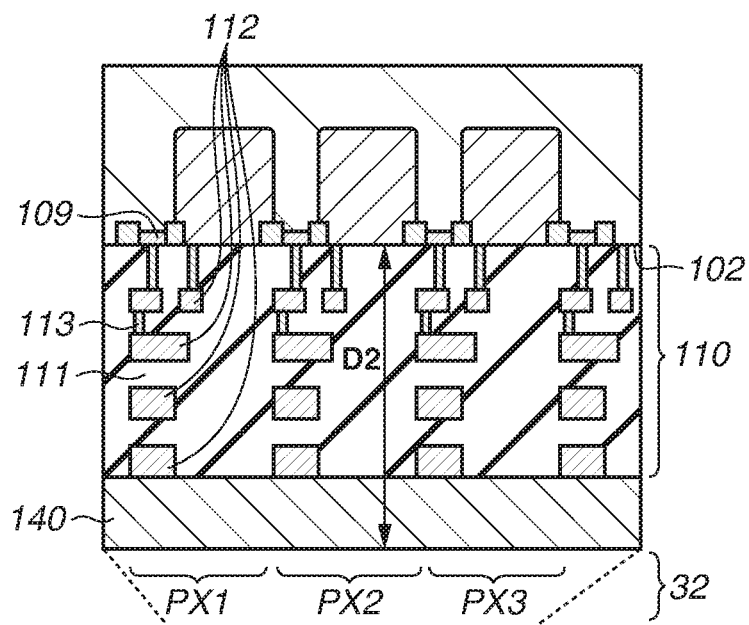
FIGS. 3A, 3B, and 3C are schematic diagrams illustrating an example detector.
Figure 3B:
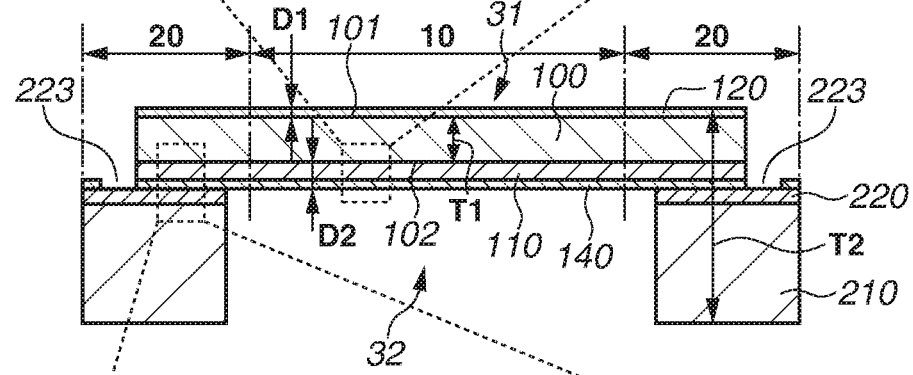
Figure 3C:
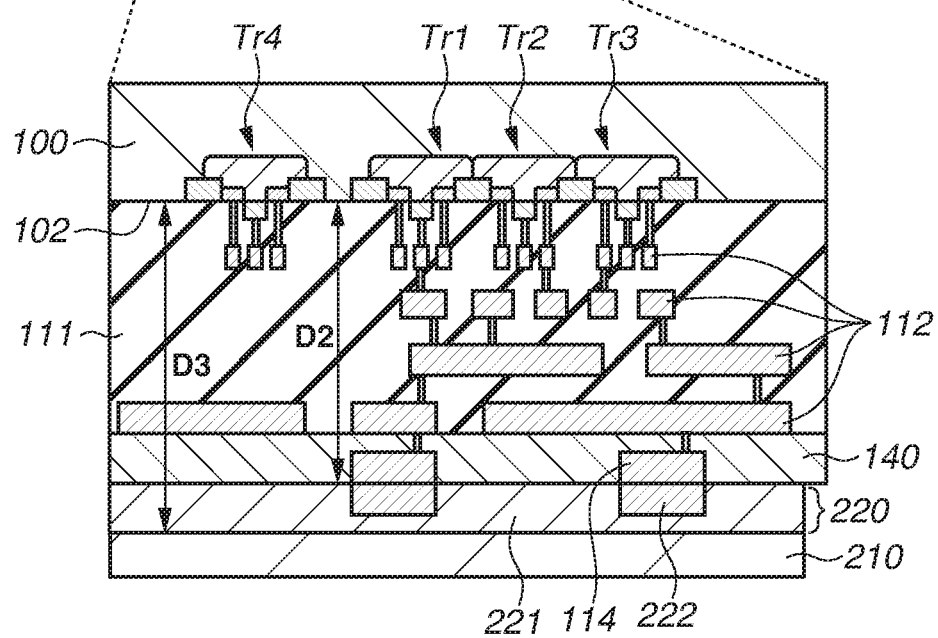

A second example embodiment will be described with reference to FIGS. 3A to 3C. FIG. 3B is a cross-sectional diagram similar to FIG. 1B. FIG. 3A illustrates a cross-sectional diagram of an enlarged cross section of a part of the detection region 10 in FIG. 2B. FIG. 3C illustrates a cross-sectional diagram of an enlarged cross section of a part of the peripheral region 20 in FIG. 3B.

In the second example embodiment, as with the first example embodiment, the thickness T1 of the semiconductor layer 100 is larger than the distance D1 between the surface 101 in the detection region 10 and the space 31 on the surface 101 side (D1<T1). The thickness T1 of the semiconductor layer 100 is larger than the distance D2 between the back surface 102 in the detection region 10 and the space 32 on the back surface 102 side (D2<T1). The second example embodiment is different from the first example embodiment in that the wiring structure 110 is provided on the back surface 102 side, and the distance D1 is smaller than the distance D2 (D1<D2). Further, the intermediate layer 220 includes an insulator layer 221 and a conductor layer 222. The insulator layer 221 is joined to a protective film 140. An electrode 114 for connection is embedded in the protective film 140 and joined to the conductor layer 222. The protective film 140 can be an insulator film made of an inorganic insulating material, such as a silicon oxide film, a silicon nitride film, a silicon carbide film, or a metal oxide film.

Figure 4A:
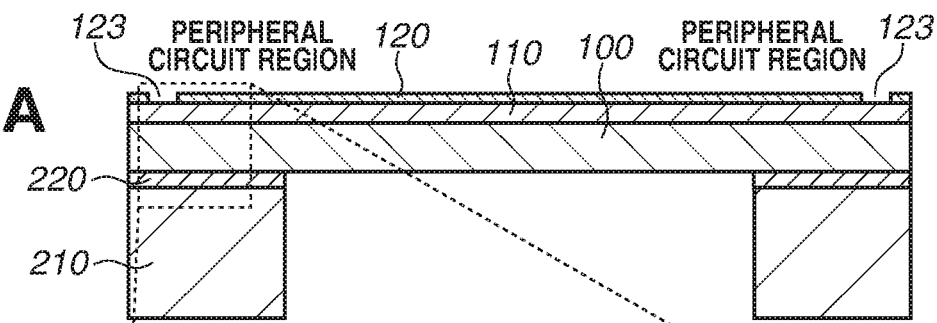
FIGS. 4A and 4B are schematic diagrams illustrating an example detector.
Figure 4B:
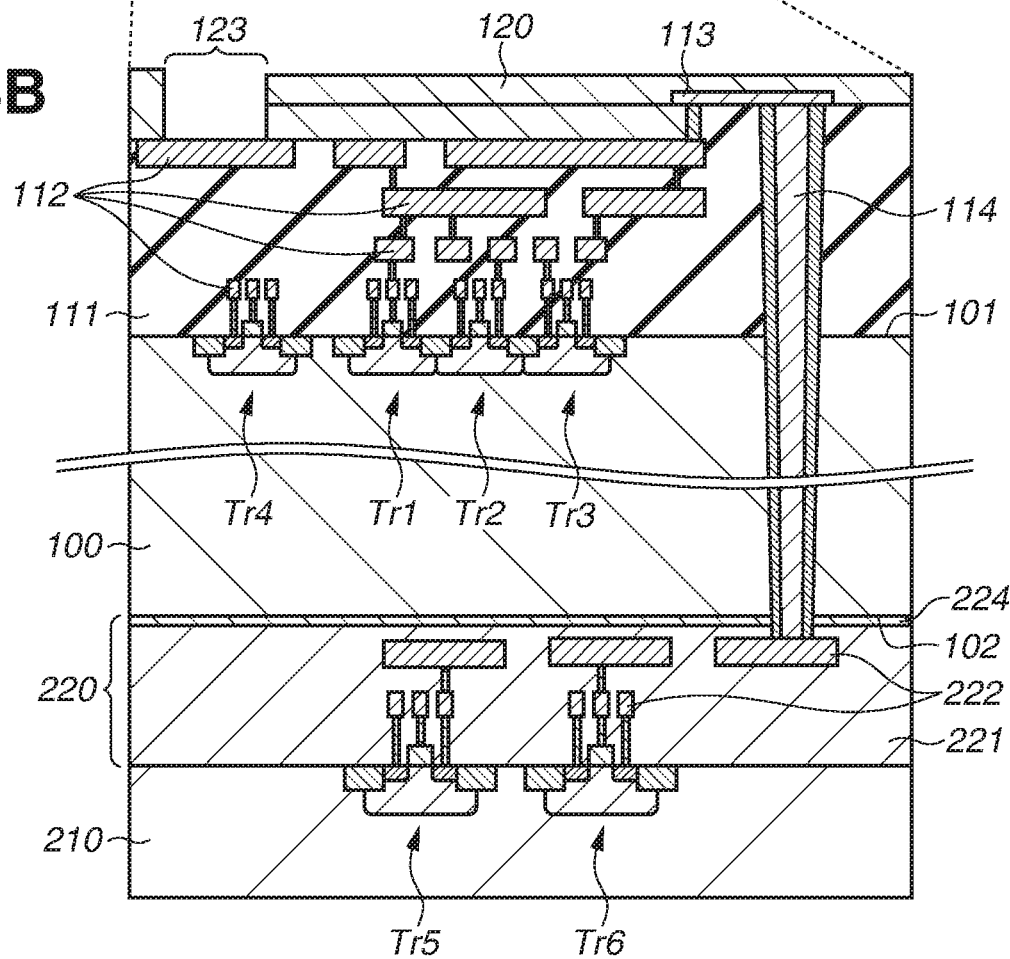

A third example embodiment will be described with reference to FIGS. 4A and 4B. FIG. 4A is a cross-sectional diagram similar to FIG. 1B. FIG. 4B illustrates a cross-sectional diagram of an enlarged cross section of a part of the peripheral region 20 in FIG. 4A. The intermediate layer 220 includes the insulator layer 221 and the conductor layer 222 as in the second example embodiment, and further includes an adhesion layer 224. The adhesion layer 224, which is provided between the insulator layer 221 and the semiconductor layer 100, bonds the insulator layer 221 and the semiconductor layer 100 together. The support unit 210, which is a semiconductor substrate, is provided with MOS transistors Tr5 and Tr6. The MOS transistor Tr6 is connected to a conductor layer 112 via the electrode 114 (a through electrode) passing through the semiconductor layer 100, and the conductive member 113 on the interlayer insulating film 111. For example, the MOS transistor Tr3 and the MOS transistor Tr6 are connected electrically. In this way, circuits are formed to be two semiconductors (the semiconductor layer 100 and the support unit 210) in the peripheral region 20. This can increase the accumulation rate of the semiconductor element of the peripheral region 20, and thus can provide peripheral circuits with higher functionality and higher performance.

Figure 5A:
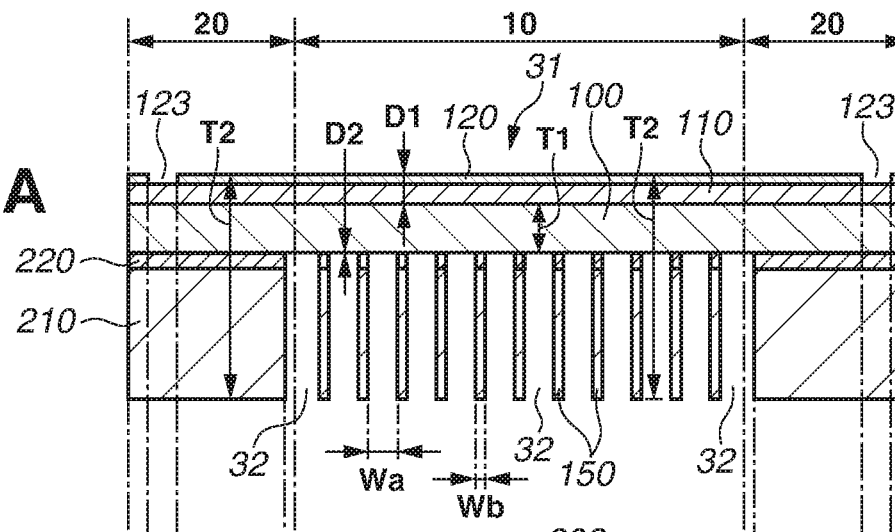
FIGS. 5A and 5B are schematic diagrams illustrating an example detector.
Figure 5B:
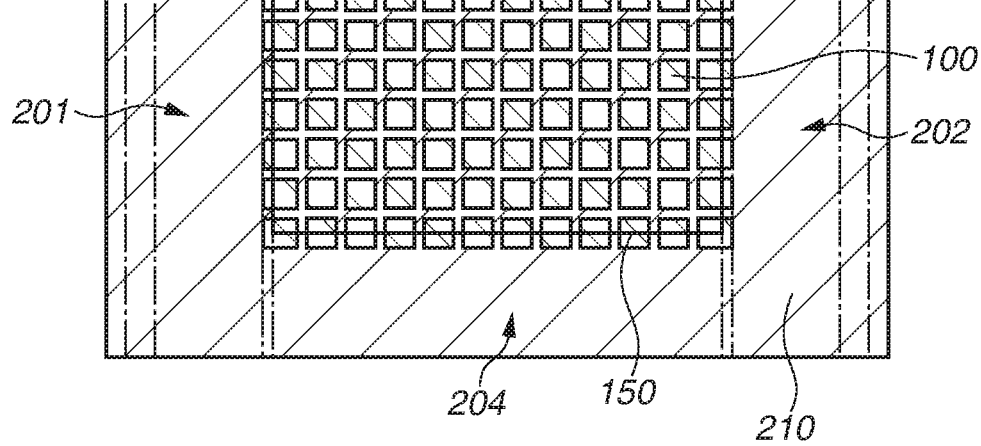

A fourth example embodiment will be described with reference to FIGS. 5A and 5B. FIG. 5A is a cross-sectional diagram of a part corresponding to the line A-B in FIG. 1A, and FIG. 5B is a plan view corresponding to FIG. 1C. The fourth example embodiment is different from the first example embodiment in that a support unit 150 is provided in the detection region 10. The support unit 210 supports the semiconductor layer 100 in the peripheral region 20, and the support unit 150 supports the semiconductor layer 100 in the detection region 10. The support unit 150 is a portion inside a range surrounded by a solid line in FIG. 5B.

The support unit 150 has an opening for bringing the space 32 close to the back surface 102 of the semiconductor layer 100 (to achieve D2<T1). The intermediate layer 220 is disposed between the support unit 150 and the semiconductor layer 100. In this example, the bottom of the opening of the support unit 150 is formed by the back surface 102 of the semiconductor layer 100. However, the bottom of the opening of the support unit 150 can be formed by the intermediate layer 220 or can be formed by the support unit 210. In a case where the bottom of the opening of the support unit 150 is formed by the intermediate layer 220, the distance D2 includes the thickness of the intermediate layer 220. To release an excessive energy ray inside the semiconductor layer 100 to the space 32, a width Wa of the opening of the support unit 150 is desirably larger than a width Wb of the support unit 150 (Wb<Wa). The width Wa is, for example, 1 μm to 10 μm, and the width Wb is, for example, 0.5 μm to 2.0 μm.

The support unit 150 of the detection region 10 extends from the support unit 210 of the peripheral region 20. The support unit 150 has a lateral extension portion that extends from the left side portion 201 to the right side portion 202 in the lateral direction, and has a vertical extension portion that extends from the upper side portion 203 to the lower side portion 204 in the vertical direction. The space 32 between the upper side portion 203 and the lower side portion 204 is separated into a plurality of spaces by the lateral extension portion in the vertical direction. The space 32 between the left side portion 201 and the right side portion 202 is separated into a plurality of spaces by the vertical extension portion in the lateral direction.

As illustrated in FIG. 5B, the support unit 150 has a lattice form. The lattice form indicates a form in which support portions extend in the vertical direction and/or the lateral direction. Examples of the lattice form include not only a form in which support portions extend in the vertical direction and the lateral direction as in FIG. 5B, but also a form in which support portions diagonally extend. The examples of the lattice form also include a stripe form in which support portions extend only in the vertical direction or only in the lateral direction. In this way, the support unit 150 has the lattice form and therefore, the strength of the support unit 150 can be increased and the strength of the entire detector IC can be increased as well.

Figures 6A, 6B:
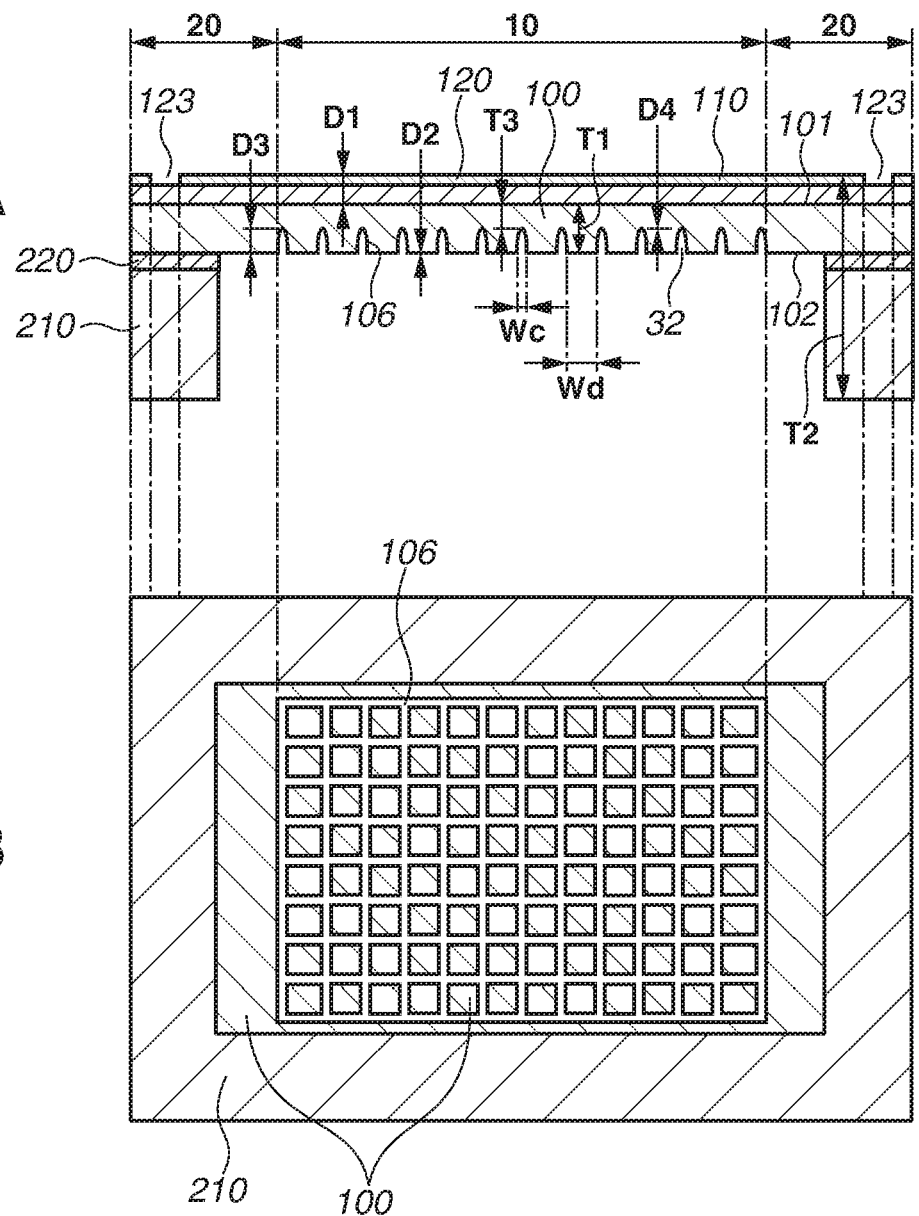
FIGS. 6A and 6B are schematic diagrams illustrating an example detector.
Figure 8A:
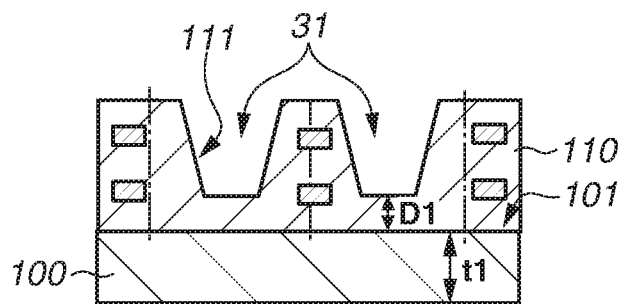
FIGS. 8A to 8F are schematic diagrams illustrating an example detector.
Figure 8B:
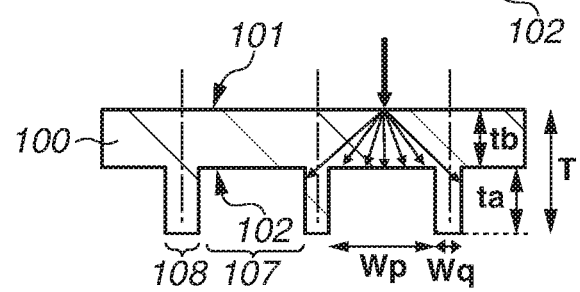
Figure 8C:
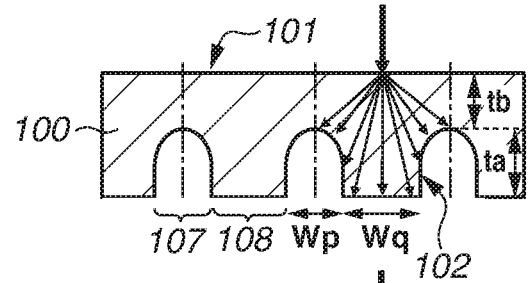
Figure 8D:
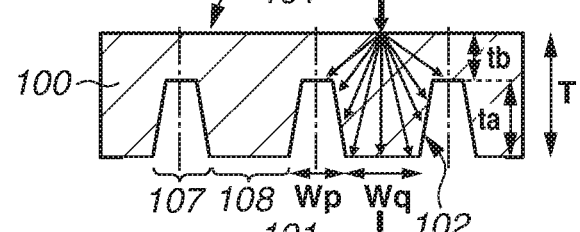
Figure 8E:
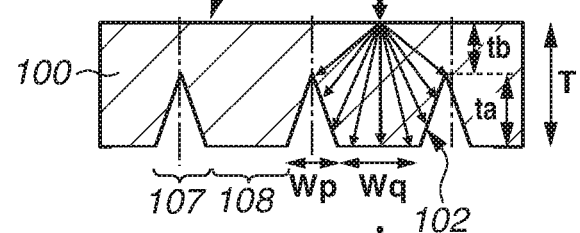
Figure 8F:
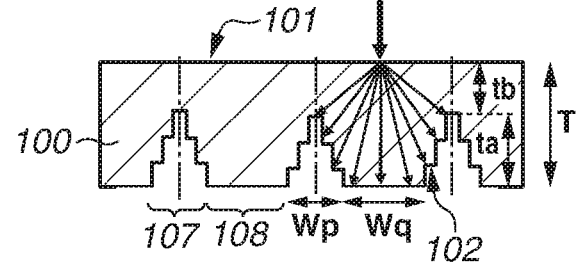
Figure 9A:
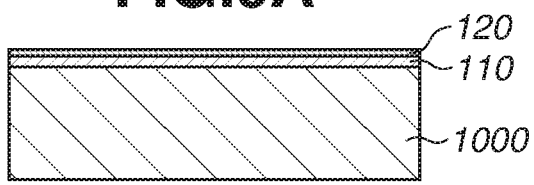
FIGS. 9A to 9H are schematic diagrams illustrating an example detector.
Figure 9E:
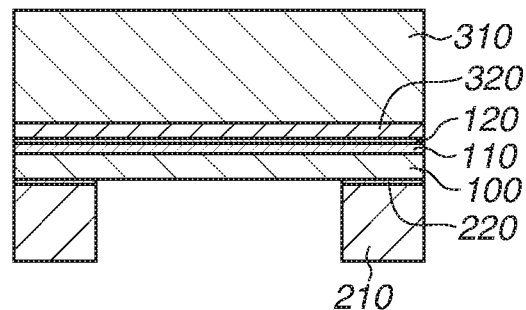
Figure 9B:
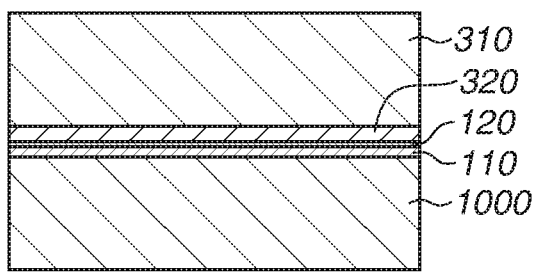
Figure 9F:
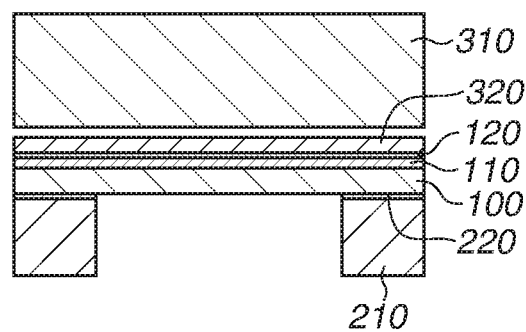
Figure 9C:
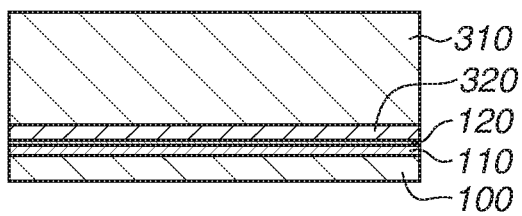
Figure 9G:
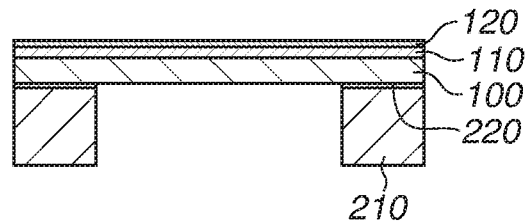
Figure 9D:
Figure 9H:
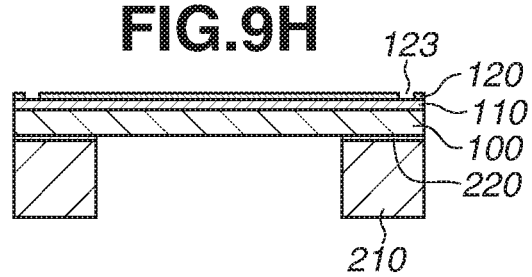
Figure 10A:
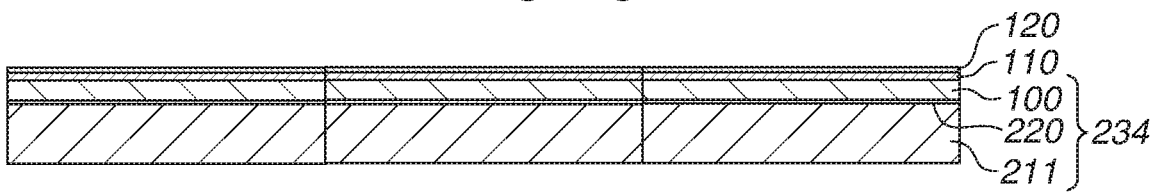
FIGS. 10A to 10E are schematic diagrams illustrating an example detector.
Figure 10B:
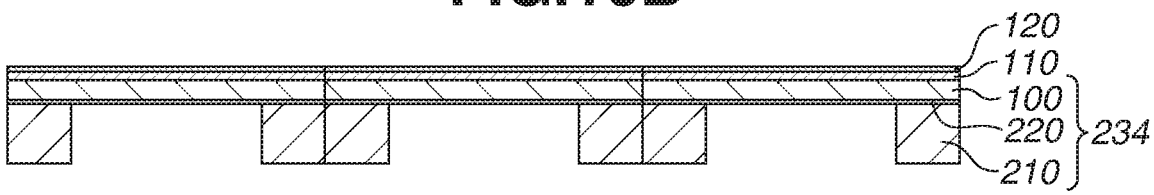
Figure 10C:
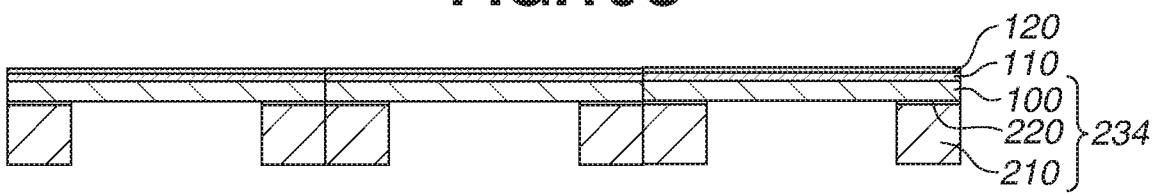
Figure 10D:
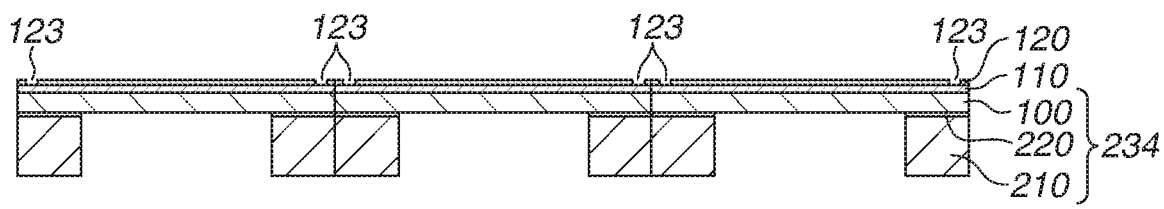
Figure 10E:
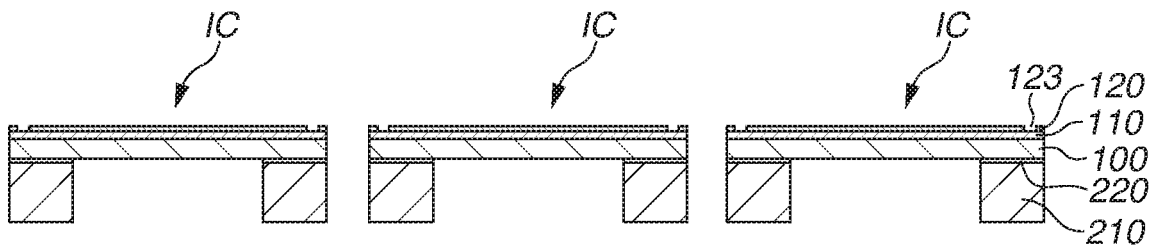

A fifth example embodiment will be described with reference to FIGS. 6A and 6B. FIG. 6A is a cross-sectional diagram of a portion corresponding to the line A-B in FIG. 1A, and FIG. 6B is a plan view corresponding to FIG. 1C.

In the detection region 10, the semiconductor layer 100 has a plurality of grooves 106 on the back surface 102 side. The groove 106 can reduce crosstalk between the pixels in the detection region 10. Because the grooves 106 are provided, a plurality of concave portions (the grooves 106) and a plurality of convex portions (the semiconductor layer 100 between the grooves 106) are alternately provided in the back surface 102 of the semiconductor layer 100 in the detection region 10.

The thickness of the semiconductor layer 100 in the detection region 10 and the peripheral region 20 is the thickness T1 and is smaller than the thickness T2 of the peripheral region 20 (T1<T2). A depth D3 of the groove 106 is equal to or less than the thickness T of the semiconductor layer 100 (D3≤T1). The depth D3 is desirably a half or less than the thickness T1 (T1/2<D3). A thickness T3 of the semiconductor layer 100 below the groove 106 is smaller than the thickness T1 of other part of the semiconductor layer 100 in the detection region 10 and the peripheral region 20 (T3<T1). Naturally, the thickness T3 is smaller than the thickness T2 (T3<T2).

As with the first example embodiment, the thickness T1 is larger than the distance D1 and the distance D2 (D1<T1, D2<T1). Further, the thickness T3 is desirably larger than the distance D1 and the distance D2 (D1<T3, D2<T3). The inside of the groove 106 is a cavity, and the space 32 is located in the groove 106. Therefore, the thickness T3 of the semiconductor layer 100 below the groove 106 is larger than a distance D4 between the space 32 in the groove 106 and the semiconductor layer 100 (D4<T3). To improve isolation performance between the pixels within the detection region 10, a width Wc of the groove 106 (the concave portion of the back surface 102) of the semiconductor layer 100 is desirably smaller than an interval Wd (the width of the convex portion of the back surface 102) of the groove 106 (Wc<Wd). Further, Wc<Wc+Wd is also desirable, and Wc≥(Wc+Wd)/2 is more desirable. The width Wc is, for example, 0.5 μm to 2.0 μm, and the interval Wd is, for example, 1 μm to 10 μm. In this example, the grooves 106 are in a lattice form. However, the groove 106 may be formed between the adjacent pixels in the vertical direction and the lateral direction, and the groove 106 may not be formed between the adjacent pixels in the diagonal direction. This can increase the strength of the semiconductor layer 100 in the detection region 10.

A sixth example embodiment will be described with reference to FIGS. 7A and 7B. FIG. 7A is a cross-sectional diagram of a portion corresponding to the line A-B in FIG.

1A, and FIG. 7B is a plan view corresponding to FIG. 1C. In the sixth example embodiment, the support unit 210 is formed of the same single crystal semiconductor as the semiconductor layer 100. The semiconductor layer 100 in the detection region 10 has the thickness T1 below the groove 106, and the thickness T1 is smaller than the thickness T2 in the peripheral region 20 (T1<T2). Further, the thickness T1 is smaller than a thickness T4 of other part of the semiconductor layer 100 in the detection region 10 (T1<T4). The thicknesses T1 and T4 are larger than the distances D1 and D2 (D1<T1, D2<T1, D1<T4, D2<T4). If the support unit 210 of the peripheral region 20 is thus formed of the same single crystal semiconductor as the semiconductor layer 100 of the detection region 10, the rigidity of the detector IC can be increased. Therefore, even if the depth D3 of the groove 106 is increased, the rigidity of the semiconductor layer 100 can be ensured. In the sixth example embodiment as well, crosstalk between the pixels in the detection region 10 can be reduced by providing the groove 106 between the pixels. To improve the isolation performance between the pixels in the detection region 10, the width Wa of the groove 106 (the concave portion of the back surface 102) of the semiconductor layer 100 is desirably smaller than the width Wb (the width of the convex portion of the back surface 102) of the semiconductor layer 100 between the grooves 106 (Wa<Wb). Further, Wa<Wa+Wb is also desirable, and Wa≥(Wa+Wb)/2 is more desirable. The width Wa is, for example, 0.5 μm to 2.0 μm, and the width Wb is, for example, 1 μm to 10 μm.

A seventh example embodiment will be described with reference to FIGS. 8A to 8F. In a form illustrated in FIG. 8A, a concave portion is provided in the interlayer insulating film 111 of the wiring structure 110, and the space 31 is provided in this concave portion. The distance D1 can be made smaller than the thickness of the wiring structure 110 by providing the concave portion in which the space 31 is located. For this reason, it becomes easy to make the distance D1 smaller than a distance t1, even if the wiring structure 110 is thick, or the semiconductor layer 100 is thin.

In the form illustrated in each of FIGS. 8B to 8F, a plurality of concave portions 107 and a plurality of convex portions 108 are alternately provided in the back surface 102 of the semiconductor layer 100. FIGS. 8B to 8F each illustrate a depth (a thickness) ta and a width Wp of the concave portion 107, a width Wq of the convex portion 108, and a thickness tb of the semiconductor layer 100 below the concave portion 107. The thickness T of the semiconductor layer 100 including the convex portion 108 is the sum of the thickness ta and the thickness tb (T=ta+tb). A thick arrow in each of FIGS. 8B to 8F indicates an electron beam as an energy ray incident on the semiconductor layer 100, and thin arrows in each of FIGS. 8B to 8F schematically indicate a state of electron scattering that occurs inside the semiconductor layer 100 due to the incident electron beam. In the form in FIG. 8B, the width Wp of the concave portion 107 of the back surface 102 is larger than the width Wq of the convex portion 108. According to such a form, the thickness tb of the semiconductor layer 100 below the concave portion 107 can be made small and therefore, the energy ray can go out from the concave portion 107 to the space 32 more easily. In the form in each of FIGS. 8C to 8, the width Wp of the concave portion 107 of the back surface 102 is smaller than the width Wq of the convex portion 108. However, the width Wp of the concave portion 107 of the back surface 102 is desirably larger than the width Wq of the convex portion 108. The width Wp is desirably a half or more of the sum of the width Wp and the width Wq (Wp≥(Wp+Wq)/2). More desirably, the width Wp is smaller than the sum of the width Wp and the width Wq (Wp<Wp+Wq). In addition, the thickness ta is desirably equal to or more than the thickness tb (ta≥tb). Such a form is advantageous in suppressing crosstalk between the pixels. The concave portion 107 has a rectangular shape in FIG. 8B. Meanwhile, the concave portion 107 has a U-shape in FIG. 8C, has a trapezoidal shape in FIG. 8D, a V-shape in FIG. 8E, and a stepped shape in FIG. 8F.

An eighth example embodiment will be described with reference to FIGS. 9A to 9H. The eighth example embodiment illustrates a method for manufacturing the detector IC. In a process a illustrated in FIG. 9A, the wiring structure 110 and the protective film 120 are formed on a semiconductor substrate 1000. In a process b illustrated in FIG. 9B, a temporary substrate 310 is fixed to a portion above the semiconductor substrate 1000 (to the portion above the wiring structure 110, i.e., onto the protective film 120) with an adhesion layer 320 interposed therebetween. In a process c illustrated in FIG. 9C, the semiconductor layer 100 is formed by reducing the thickness of the semiconductor substrate 1000 to a predetermined thickness t1. In a process d illustrated in FIG. 9D, a support member 2100 which becomes the support unit 210 is prepared. In a process e illustrated in FIG. 9E, the support member 2100 is joined to the semiconductor layer 100 with the intermediate layer 220 interposed therebetween. The support unit 210 is thereby formed from the support member 2100. In a process f illustrated in FIG. 9F, the temporary substrate 310 is removed from the portion above the semiconductor layer 100 (from the portion above the wiring structure 110, i.e., from the protective film 120). Further, in a process g illustrated in FIG. 9G, the adhesion layer 320 is removed. In a process h illustrated in FIG. 9H, the opening 123 is formed in the protective film 120. The detector IC can be thus formed.

A ninth example embodiment will be described with reference to FIGS. 10A to 10E. In a process a illustrated in FIG. 10A, the wiring structure 110 and the protective film 120 are formed on a SOI wafer 234 having the semiconductor layer 100, the intermediate layer 220, which is an insulator layer, and a base 211. In a process b illustrated in FIG. 10B, a portion corresponding to the detection region 10 is removed while a portion of the base 211 which becomes the peripheral region 20, remains. In a process c illustrated in FIG. 10C, the opening 123 is formed in the protective film 120. In a process d illustrated in FIG. 10D, the SOI wafer 234 is diced into a plurality of detector ICs. The detector IC can be thus manufactured.

Figure 11:
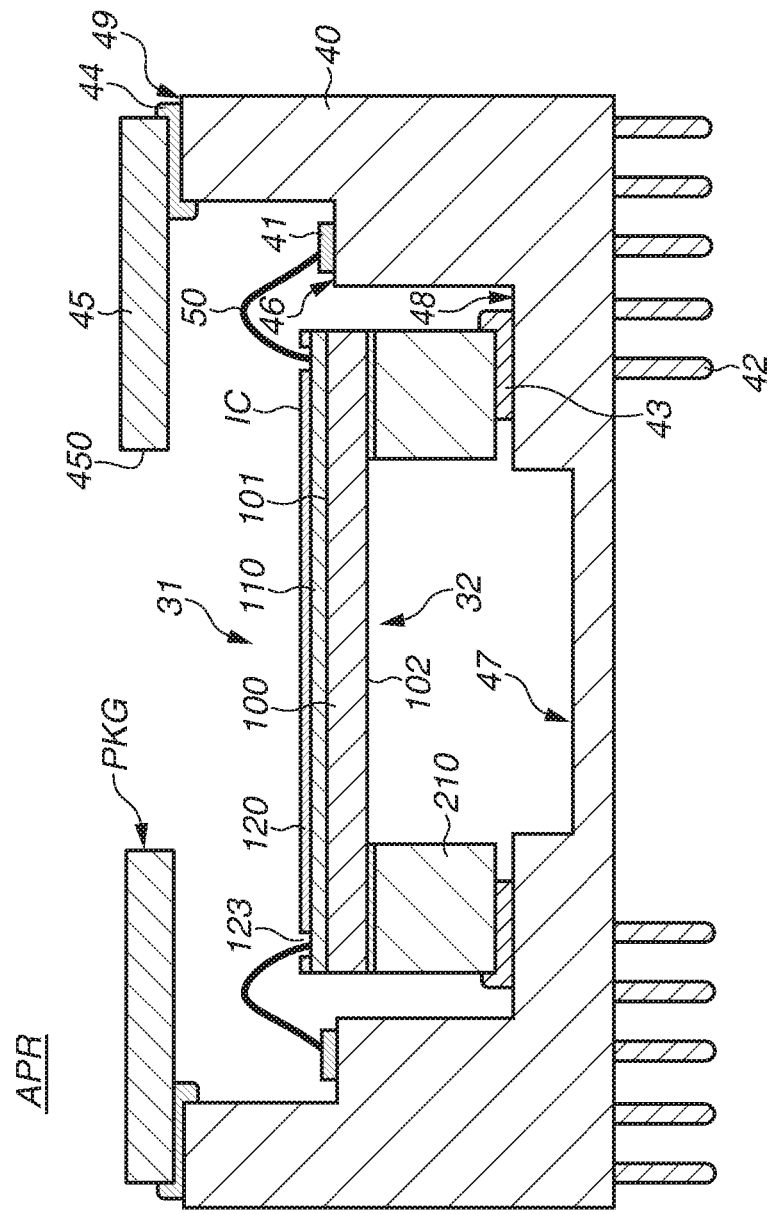
FIG. 11 is a schematic diagram illustrating an example detector.

A tenth example embodiment will be described with reference to FIG. 11. The tenth example embodiment corresponds to a detection apparatus APR including the detector IC and a package PKG serving as a container for containing the detector IC. The package PKG includes a base 40 and a cover 45. The package PKG further includes an internal terminal 41, an external terminal 42, and binders 43 and 44. The base 40 has a concave shape having a plurality of stage portions including a lower stage portion 47, a mounting stage portion 48, a terminal stage portion 46, and an upper stage portion 49. The base 40 is made of, for example, ceramic, but can be formed of resin such as glass epoxy. In addition to the detector IC, electronic components such as a resistor, a condenser, a diode, a transistor, and an integrated circuit can be mounted on the base 40, by using the base 40 as a wiring board. The peripheral region 20 of the detector IC, in particular, the support unit 210, is fixed to the mounting stage portion 48 by the binder 43. Heat generated in the detector IC is radiated to the mounting stage portion 48 via the support unit 210, and then radiated from the base 40 to the outside. The detection apparatus APR or an equipment (to be described below) including the detection apparatus APR can be configured to cool the base 40 forcibly. The terminal stage portion 46 is provided with the internal terminal 41, and the detector IC is electrically connected to the internal terminal 41 via a bonding wire 50. The cover 45 is fixed to the upper stage portion 49 by the binder 44. The binder 44 is resin or wax. The cover 45 has an opening 450 above the detection region 10. The space 31 is formed between the opening 450 and the surface 101. The space 32 is formed between the lower stage portion 47 and the back surface 102. The lower stage portion 47 is recessed to be lower than the mounting stage portion 48. Therefore, the space 32 is wide and the distance between the lower stage portion 47 and the back surface 102 is large. This suppresses reflection of the energy ray passing through the semiconductor layer 100, off the lower stage portion 47. The base 40 may be configured to have an opening passing through the base 40 to connect to the space 32, by removing the lower stage portion 47. In this case, as with the opening 450, the opening of the base 40 may overlap with the detection region 10. A pin grid array (PGA) terminal is suitable for the external terminal 42, but a land grid array (LGA) terminal attachable to a pin-type socket may be adopted. Providing the PGA terminal as the external terminal 42 makes it easy to replace the detector IC in the equipment to be described below. The external terminal 42 may be a connector to which an external cable can be detachably attached. This connector can be mounted on the base 40 by soldering the connector to the base 40 provided as the wiring board.

An eleventh example embodiment will be described with reference to FIG. 12A. On an equipment EQP illustrated in FIG. 12A, the detector IC is mounted. The detector IC is included in the detection apparatus APR. As described above, the detection apparatus APR can include the package PKG containing the detector IC. The equipment EQP can further include at least one of an optical system OPT, a controller CTRL, a processor PRCS, a display DSPL, and a memory MMRY. The optical system OPT forms an image on the detector IC based on an energy ray. The optical system OPT is, for example, an energy source, a lens, a shutter, or a mirror. The controller CTRL controls the detector IC, and is, for example, a semiconductor device such as an application specific integrated circuit (ASIC). The processor PRCS processes a signal output from the detector IC, and forms an analog front end (AFE) or a digital front end (DFE). The processor PRCS is a semiconductor device such as a central processing unit (CPU) or an ASIC. The display DSPL is an electroluminescent display (EL) or a liquid crystal display for displaying information (an image) obtained by the detector IC. The memory MMRY is a magnetic device or a semiconductor device for storing information (an image) obtained by the detector IC. The memory MMRY is a volatile memory such as a static random access memory (SRAM) or a dynamic random access memory (DRAM), or a nonvolatile memory such as a flash memory or a hard disk drive. A machine MCHN has a movable unit or a propelling unit such as a motor or an engine. In the equipment EQP, the display DSPL displays a signal output from the detector IC, and a transmitter (not illustrated) included in the equipment EQP transmits a signal to the outside. Therefore, the equipment EQP desirably further includes the memory MMRY and the processor PRCS, other than the memory circuit and the operation circuit of the detector IC.

Figure 12A:
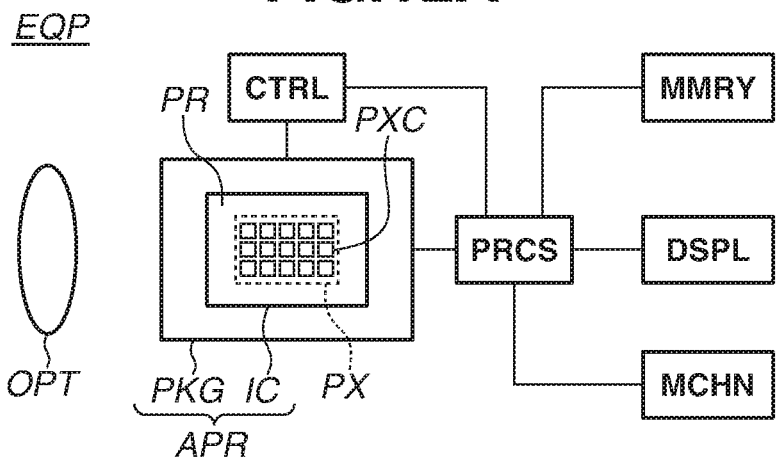
FIGS. 12A and 12B are schematic diagrams illustrating an example detector.

The equipment EQP illustrated in FIG. 12A can be an electronic equipment such as an information terminal (e.g., a smartphone or a wearable terminal), or a camera (e.g., a lens-interchangeable camera, a compact camera, a video camera, or a surveillance camera) having an image-capturing function. The machine MCHN in the camera can drive a component of the optical system OPT for zooming, focusing, and shutter operation. Further, the equipment EQP can be a transport equipment (a moving body) such as a vehicle, a ship, a flight vehicle, or an artificial satellite. The machine MCHN in the transport equipment can be used as a mobile machine. The equipment EQP provided as the transport equipment is suitable for transportation of the detection apparatus APR, or assistance and/or automation of driving (steering) by using the image-capturing function. The processor PRCS for the assistance and/or automation of driving (steering) can perform processing for operating the machine MCHN provided as the mobile machine, based on information obtained by the detection apparatus APR.

Further, the equipment EQP can be an analysis instrument for analysis using a ray such as an X-ray or an electron beam. Furthermore, the equipment EQP can be a medical equipment for analysis using a ray such as an X-ray or an electron beam. The analysis instrument and the medical equipment can include a holder (a stage) for holding an object to be an analysis target, such as a sample or a patient. The holder can be configured to heat or cool the object (the sample). In a case were the holder cools the object, the object can be frozen (subjected to cryo-processing). The detector IC is disposed to detect an energy ray traveling from the target toward the detector IC. The analysis instrument and the medical equipment can include an energy source for emitting an energy ray to the target. The energy source is, for example, a light source, an electron source, or a radiation source. The energy ray to be detected by the detector IC may be an energy ray passing through the target after being emitted from the energy source to the target, or may be an energy ray reflected from the target after being emitted from the energy source to the target. Alternatively, the energy ray to be detected by the detector IC may be an energy ray secondarily generated by emission from the energy source to the target. The energy ray secondarily generated is an electron beam such as a secondary electron or an auger electron, or a light beam by cathode luminescence, or radiation such as a characteristic X-ray.

The detector IC according to the present example embodiment is of high value to the designer, manufacturer, distributor, buyer, and/or the user of the detector IC. Therefore, the value of the equipment EQP can be increased by mounting the detector IC on the equipment EQP. Accordingly, to increase the value of the equipment EQP, it is advantageous to decide mounting of the detector IC of the present example embodiment on the equipment EQP, in manufacturing and selling of the equipment EQP.

Figure 12B:
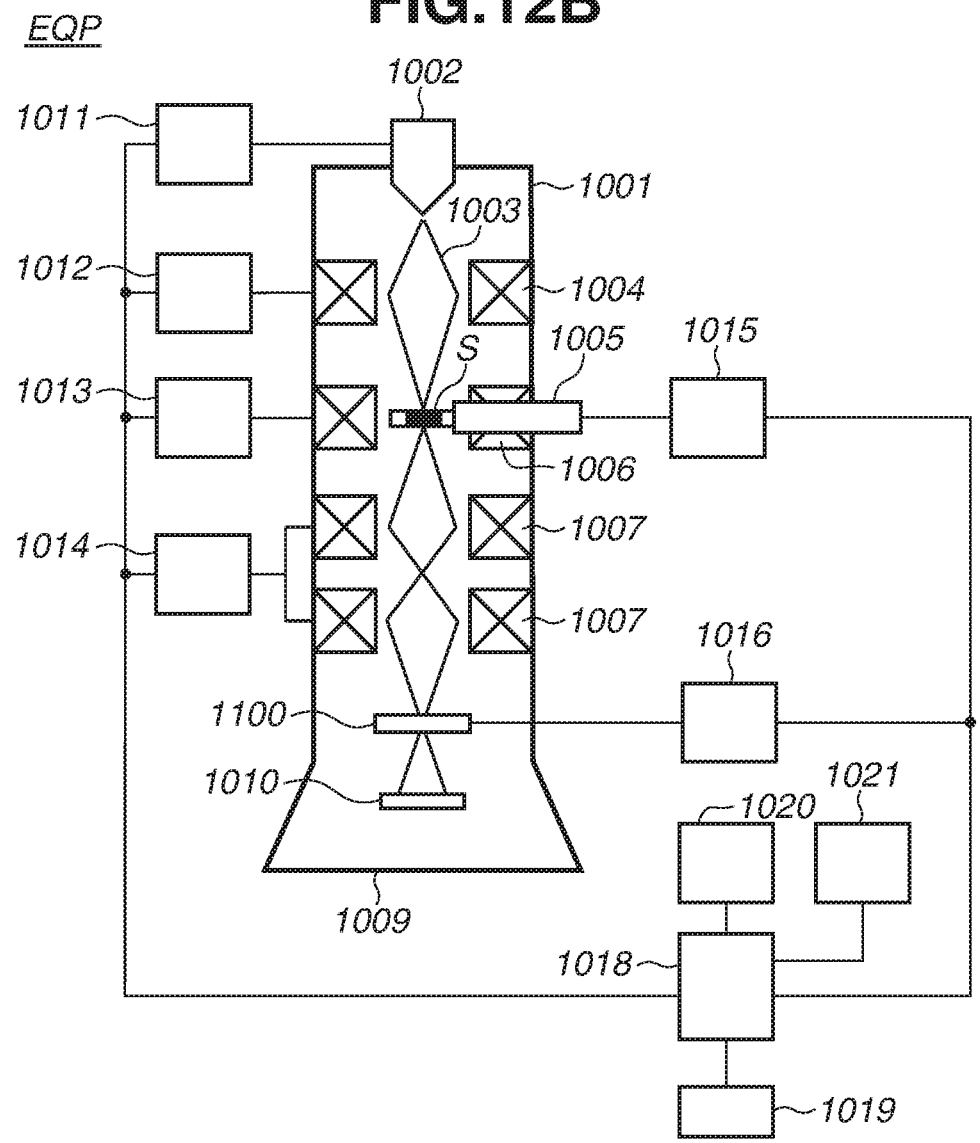

A twelfth example embodiment will be described with reference to FIG. 12B. FIG. 12B is a schematic diagram illustrating a configuration of a transmission electron microscope (TEM), which is equipped with the detector IC described above in the example embodiment. An electron beam 1003 is an energy ray emitted from an electron source 1002 (an electron gun) of the equipment EQP provided as the electron microscope. The electron beam 1003 is converged by an irradiation lens 1004 and is emitted to a sample S. The sample S is provided as an analysis target and held by a sample holder. A space through which the electron beam 1003 passes is formed of a vacuum chamber 1001 (a lens barrel) included in the equipment EQP, and this space is maintained as a vacuum. The detector IC is disposed to face the vacuum space through which the electron beam 1003 passes. In other words, at least one of the space 31 and the space 32 connects to the space formed of the vacuum chamber 1001. Therefore, between the space 31 and the space 32, at least one space from which the electron beam 1003 is to enter the semiconductor layer 100 is a vacuum. The other space from which the electron beam 1003 goes out is desirably also a vacuum. This is because, if atmospheric pressure varies between the spaces 31 and 32 provided above and below the semiconductor layer 100, a large force is applied to the semiconductor layer 100. The electron beam 1003 passing through the sample S is enlarged by an object lens 1006 and an enlargement lens system 1007, and then projected onto the detector IC. An electron optical system for emitting an electron beam to the sample S is referred to as an irradiation optical system, and an electron optical system for forming an image on the detector IC based on an electron beam passing through the sample S is referred to as a focusing optical system. The sample holder may be provided with a sample holding stage for maintaining a low-temperature state, in order to measure the sample S in a frozen (cryo) state.

An electron source controller 1011 controls the electron source 1002. An irradiation lens controller 1012 controls the irradiation lens 1004. An object lens controller 1013 controls the object lens 1006. An enlargement lens system controller 1014 controls the enlargement lens system 1007. A holder controller 1015 for controlling a driving mechanism of the sample holder controls a controlling mechanism 1005 for the sample holder.

The detector IC detects the electron beam 1003 passing through the sample S. A signal processor 1016 and an image processor 1018 provided as the processor PRCS process an output signal from the detector IC, and thereby generate an image signal. An image display monitor 1020 and an analysis monitor 1021 corresponding to the display DSPL display the generated image signal (a transmission electron image).

A direct detection camera 1009 is provided in a lower part of the equipment EQP. The direct detection camera 1009 includes a direct detector 1100. The direct detector 1100 corresponds to the detector IC. The direct detection camera 1009 corresponds to the detection apparatus APR including the detector IC. At least a part of the direct detection camera 1009 is provided inside the direct detection camera 1009 to be exposed to the vacuum space formed by the vacuum chamber 1001. The electron beam 1003 passing through the direct detector 1100 is absorbed by an electron beam absorption member 1010 such as the base 40 of the package PKG described above. The direct detection camera 1009 can be detachable from the vacuum chamber 1001. In a case where the direct detector 1100 deteriorates due to irradiation of the electron beam, the direct detection camera 1009 can be removed from the vacuum chamber 1001 and replaced with a new one. To enable replacement of the direct detection camera 1009 without breaking the vacuum of the vacuum chamber 1001, an openable/closable vacuum partition may be provided between the direct detection camera 1009 and the vacuum chamber 1001.

The electron source controller 1011, the irradiation lens controller 1012, the object lens controller 1013, the enlargement lens system controller 1014, and the holder controller 1015 are each connected to the image processor 1018. This allows exchange of data with each other to set image-capturing conditions for the electron microscope. Based on a signal from the image processor 1018, driving control for the sample holder and setting of observation conditions for each lens can be performed.

An operator prepares the sample S to be an image-capturing target, and sets image-capturing conditions by using an input device 1019 connected to the image processor 1018. The operator inputs predetermined data to each of the electron source controller 1011, the irradiation lens controller 1012, the object lens controller 1013, and the enlargement lens system controller 1014, in order to obtain desired acceleration voltage, factor, and observation mode. In addition, the operator inputs conditions such as the number of continuous field images, an image-capturing start position, and a moving speed of the sample holder, into the image processor 1018 by using the input device 1019 such as a mouse, a keyboard, or a touch panel. The image processor 1018 may automatically set the conditions irrespective of the input by the operator.

According to the example embodiments of the disclosure, a technology that is advantageous in increasing energy-ray detection accuracy of an energy-ray detector can be offered.

While the disclosure has been described with reference to example embodiments, it is to be understood that the invention is not limited to the disclosed example embodiments. The scope of the following claims is to be accorded the broadest interpretation so as to encompass all such modifications and equivalent structures and functions.

This application claims the benefit of Japanese Patent Application No. 2017-214831, filed Nov. 7, 2017, which is hereby incorporated by reference herein in its entirety.

What is claimed is:

1. A detector having a detection region for detecting an energy ray, and a peripheral region located around the detection region in a plan view with respect to the detection region, the detector comprising:
   a semiconductor layer included in the detection region and the peripheral region, and having a first surface and a second surface opposite to the first surface; and
   a wiring structure included in at least the detection region, and disposed between a space on the first surface side with respect to the semiconductor layer and a space on the second surface side with respect to the semiconductor layer,
   wherein a thickness of the semiconductor layer in at least a part of the detection region is smaller than 100 µm, in the detection region, a distance between the space on the first surface side and the space on the second surface side between which the semiconductor layer is interposed, is smaller than a thickness of the peripheral region including the semiconductor layer, and the thickness of the semiconductor layer is larger than a distance between the first surface in the detection region and the space on the first surface side, and a distance between the second surface in the detection region and the space on the second surface side.

2. The detector according to claim 1, wherein the distance between the first surface in the detection region and the space on the first surface side is larger than the distance between the second surface in the detection region and the space on the second surface side.

3. The detector according to claim 1, wherein a plurality of conductor layers is provided between the first surface and the space on the first surface side.

4. The detector according to claim 3,
wherein, in a first direction in the plan view, the space on the second surface side is located between a first portion of the peripheral region and a second portion of the peripheral region, and
wherein, in a second direction orthogonal to the first direction in the plan view, the space on the second surface side is located between a third portion of the peripheral region and a fourth portion of the peripheral region.

5. The detector according to claim 4,
wherein the detection region has a portion extending from the first portion to the second portion, and
wherein the space between the third portion and the fourth portion is separated by the extending portion.

6. The detector according to claim 1, wherein, in the detection region, a plurality of concave portions and a plurality of convex portions are alternately provided in the second surface, and a width of the concave portion is larger than a width of the convex portion.

7. The detector according to claim 1 wherein, in the detection region, a plurality of concave portions and a plurality of convex portions are alternately provided in the second surface, and a width of the concave portion is smaller than a width of the convex portion.

8. The detector according to claim 1, further comprising an insulator film provided between the space on the second surface side and the semiconductor layer.

9. The detector according to claim 1, wherein the peripheral region includes a support unit supporting the semiconductor layer in the peripheral region, and an insulator layer is provided between the semiconductor layer and the support unit.

10. The detector according to claim 1, wherein the detector satisfies at least one of conditions:
that the semiconductor layer has the thickness of larger than 10 μm,
that the semiconductor layer has the thickness of smaller than 50 μm, and
that the peripheral region has the thickness of 100 μm or more and 500 μm or less.

11. The detector according to claim 1, wherein a plurality of readout circuits each including a plurality of metal oxide semiconductor (MOS) transistors is provided in a matrix in the detection region, and a complementary metal oxide semiconductor (CMOS) circuit is provided in the peripheral region.

12. A detection apparatus comprising:
the detector according to claim 1; and
a package including a base,
wherein the peripheral region is fixed to the base.

13. The detection apparatus according to claim 12, wherein the package has an opening overlapping with the detection region.

14. A detector having a detection region for detecting an energy ray, and a peripheral region located around the detection region in a plan view with respect to the detection region, the detector comprising:
a semiconductor layer included in the detection region and the peripheral region, and having a first surface and a second surface opposite to the first surface; and
a wiring structure included in at least the detection region, and disposed between a space on the first surface side with respect to the semiconductor layer and a space on the second surface side with respect to the semiconductor layer,
wherein a thickness of the semiconductor layer in at least a part of the detection region is smaller than other part of the semiconductor layer, and
wherein the thickness of the semiconductor layer is larger than a distance between the first surface in the detection region and the space on the first surface side, and a distance between the second surface in the detection region and the space on the second surface side.

15. A detector having a detection region for detecting an energy ray, and a peripheral region located around the detection region in a plan view with respect to the detection region, the detector comprising:
a semiconductor layer included in the detection region and the peripheral region; and
a support unit supporting the semiconductor layer in the detection region and the peripheral region,
wherein the support unit has a lattice form in the detection region.

16. A detector having a detection region for detecting an energy ray, and a peripheral region located around the detection region in a plan view with respect to the detection region, the detector comprising:
a semiconductor layer included in the detection region and the peripheral region, and having a first surface and a second surface opposite to the first surface; and
a wiring structure included in at least the detection region, and disposed between a space on the first surface side with respect to the semiconductor layer and the semiconductor layer,
wherein a thickness of the semiconductor layer in at least a part of the detection region is smaller than 100 μm, in the detection region, a distance between the space on the first surface side and the second surface side is smaller than a thickness of the peripheral region including the semiconductor layer, and the thickness of the semiconductor layer is larger than a distance between the first surface in the detection region and the space on the first surface side.

17. The detector according to claim 16,
wherein, in a first direction in the plan view, the space on the second surface side is located between a first portion of the peripheral region and a second portion of the peripheral region, and
wherein, in a second direction orthogonal to the first direction in the plan view, the space on the second surface side is located between a third portion of the peripheral region and a fourth portion of the peripheral region.

18. The detector according to claim 17,
wherein the detection region has a portion extending from the first portion to the second portion, and
wherein the space between the third portion and the fourth portion is separated by the extending portion.

19. The detector according to claim 16, wherein, in the detection region, a plurality of concave portions and a plurality of convex portions are alternately provided in the second surface, and a width of the concave portion is larger than a width of the convex portion.

20. The detector according to claim 16, wherein, in the detection region, a plurality of concave portions and a plurality of convex portions are alternately provided in the second surface, and a width of the concave portion is smaller than a width of the convex portion.

21. The detector according to claim 16, further comprising an insulator film provided between the space on the second surface side and the semiconductor layer.

22. The detector according to claim 16, wherein the peripheral region includes a support unit supporting the semiconductor layer in the peripheral region, and an insulator layer is provided between the semiconductor layer and the support unit.

23. The detector according to claim 16, wherein the detector satisfies at least one of conditions:
- that the semiconductor layer has the thickness of larger than 10 µm,
- that the semiconductor layer has the thickness of smaller than 100 µm, and
- that the peripheral region has the thickness of 100 µm or more and 500 µm or less.

24. A detector having a detection region for detecting an energy ray, and a peripheral region located around the detection region in a plan view with respect to the detection region, the detector comprising:
- a semiconductor layer included in the detection region and the peripheral region, and having a first surface and a second surface opposite to the first surface; and
- a wiring structure included in at least the detection region, and disposed between a space on the first surface side with respect to the semiconductor layer and the semiconductor layer,
- wherein a thickness of the semiconductor layer in at least a part of the detection region is smaller than other part of the semiconductor layer, and
- wherein the thickness of the semiconductor layer is larger than a distance between the first surface in the detection region and the space on the first surface side.

* * * * *